United States Patent
Yamada

(10) Patent No.: US 7,408,390 B2
(45) Date of Patent: Aug. 5, 2008

(54) DC TO DC CONVERTER AND VOLTAGE DETECTING CIRCUIT AND CURRENT DETECTING CIRCUIT THEREOF

(75) Inventor: Kouhei Yamada, Matsumoto (JP)

(73) Assignee: Fuji Electric Device Technology Co., Ltd. (JP)

(*) Notice: Subject to any disclaimer, the term of this patent is extended or adjusted under 35 U.S.C. 154(b) by 17 days.

(21) Appl. No.: 11/387,105

(22) Filed: Mar. 22, 2006

(65) Prior Publication Data

US 2006/0261860 A1 Nov. 23, 2006

(30) Foreign Application Priority Data

May 17, 2005 (JP) ............... 2005-143415

(51) Int. Cl.
*H03K 17/00* (2006.01)
(52) U.S. Cl. ............... 327/124; 327/307; 330/9
(58) Field of Classification Search ......... 327/124, 327/307; 330/9
See application file for complete search history.

(56) References Cited

U.S. PATENT DOCUMENTS

| | | | | |
|---|---|---|---|---|
| 3,516,002 A | * | 6/1970 | Hillis | 330/51 |
| 3,638,129 A | * | 1/1972 | Pryor | 330/9 |
| 3,694,760 A | * | 9/1972 | Loessi | 330/9 |
| 6,031,420 A | * | 2/2000 | Vander Voorde | 330/9 |
| 6,507,241 B1 | * | 1/2003 | Ritter | 330/9 |
| 6,621,334 B2 | * | 9/2003 | Ausserlechner et al. | 330/9 |
| 2005/0057229 A1 | | 3/2005 | Kobayashi | |

FOREIGN PATENT DOCUMENTS

JP 2005-65447 A 3/2005

* cited by examiner

*Primary Examiner*—Kenneth B. Wells
(74) *Attorney, Agent, or Firm*—Rossi, Kimms & McDowell, LLP

(57) ABSTRACT

A DC to DC converter includes a current detecting circuit having a level shift circuit, which includes a resistor and a current source. A first low-pass filter is led out from a node via a signal line and includes a resistor and a capacitor. A first switch is provided after the level shift circuit, a second switch is provided after the low-pass filter, a second low-pass filter, which includes a resistor and a capacitor, an operational amplifier, a third switch is provided between an output terminal and an inverted input terminal of the operational amplifier, and a capacitor is provided between the inverted input terminal of the operational amplifier and GND. An output current is detected with high accuracy without lowering the efficiency by detection resistance.

12 Claims, 4 Drawing Sheets

DC TO DC CONVERTER AND VOLTAGE DETECTING CIRCUIT AND CURRENT DETECTING CIRCUIT THEREOF

BACKGROUND

A conventional DC to DC converter circuit, such as a step-down synchronous rectification switching converter, acquires a DC voltage, different from a DC power having a substantially constant voltage, by switching a transistor element. In such a DC to DC converter circuit, for example, when providing overcurrent protection for a load or detecting a light load state having a small output current and realizing a function of automatically shifting to a light load mode, an average current actually supplied to the load must be detected, as disclosed in JP-A-2005-65447 and US 2005/0057229 A1.

FIG. 4 is a circuit diagram showing a current detecting device 90 of a conventional DC to DC converter. The current detecting device has a control circuit 91, which is connected to a switching circuit 92, that lowers and controls the power supply voltage of a DC input power source VDD to a predetermined DC voltage. The switching circuit 92 forming an output stage includes a high-side switch SW91 and a low-side switch SW92. The high-side switch SW91 is supplied with the DC input power VDD from one end and has the other end connected to one end of the low-side switch SW92. The low-side switch SW92 has the other end grounded. A load 94 is connected to the switching circuit 92 via a smoothing circuit 93, which includes an inductor L91 and an output capacitor C91. As the pair of switches SW91 and SW92 are alternately turned on and off at the timing determined by the control circuit 91, an output voltage $V_{O90}$ of predetermined magnitude is supplied to the load 94. The synchronous rectification DC to DC converter is thus constructed. A low-pass filter is provided between a node M90 of the switching circuit 92 and the smoothing circuit 93, and a detection terminal 96. This low-pass filter 95 includes a filter resistor $R_{LP91}$ having one end connected to the node M90 and having the other end connected to the detection terminal 96, and a filter capacitor $C_{LP91}$ having one end connected to the other end side of the filter resistor $R_{LP91}$ and having the other end grounded.

In the switching circuit 92 of FIG. 4, each of the pair of switches SW91 and SW92 has a switching transistor, such as a MOSFET, with a parasitic resistance component. In FIG. 4, the on-resistance components of the switches SW91 and SW92 are explicitly shown as $R_{hi}$, $R_{low}$. Diodes D91 and D92 are connected parallel to the respective switches SW91 and SW92. The diodes D91 and D92 can be parasitic diodes generated when a MOS transistor is used as the switching transistor.

The current detecting device 90 detects an average value of a current flowing through the inductor L91 (i.e., output current) based on the difference between a voltage Vma output to the detection terminal 96 of the current detecting device 90 and the output voltage $V_{O90}$ being equal to an average value of voltage drop due to a parasitic series resistance $R_{ind91}$ of the inductor L91. This current detecting device 90 can advantageously avoid efficiency loss caused by power loss of the detection resistance, in comparison with the case where the current detection resistance is connected in series with the inductor.

However, the value of the parasitic series resistance $R_{ind91}$ of the inductor L91 is small. Particularly, when the device is used for detecting a light load state, the difference between the voltage Vma and the output voltage $V_{O90}$ is several mV or less. Therefore, when comparing the two voltages by an ordinary amplifier, a large error can occur because of the variation in the input offset voltage, thus making such a device unpractical.

Accordingly, there remains a need to provide a voltage detecting circuit and a current detecting circuit that can detect an output current with high accuracy without lowering the efficiency by detection resistance. The present invention addresses this need.

SUMMARY OF THE INVENTION

The present invention relates to a DC to DC converter and a voltage detecting circuit and a current detecting circuit thereof, and particularly to a voltage detecting circuit and a current detecting circuit that can detect a minute voltage.

One aspect of the present invention is a current detecting circuit that can be applied to a DC to DC converter circuit that has a transistor element for converting a DC input voltage to an AC voltage and an inductor, for acquiring a desired DC voltage with a smoother for smoothing the AC voltage. The current detecting circuit can include, an output unit, a switch, and an operational amplifier.

The output unit selectively outputs a voltage corresponding to the AC voltage, which can be a voltage input to the smoother, or a voltage corresponding to the DC voltage, which can be a voltage output from the smoother. The capacitor can be charged with the voltage corresponding to the DC voltage. The switch can turn on or off in accordance with the state of the output unit. The operational amplifier can have an output of the output unit input to a non-inverted output terminal thereof. The operational amplifier can operate as a voltage follower to charge the capacitor as the switch turns on when the voltage corresponding to the DC or AC voltage is input, and can operate as a comparator to compare the voltage charged in the capacitor and the voltage corresponding to the AC or DC voltage as the switch turns off when the voltage corresponding to the AC or DC voltage is input.

Another aspect of the present invention is a voltage detecting circuit that includes an output unit, a capacitor, a switch, and an operational amplifier. The output unit can selectively output a first (e.g., AC) or second (e.g., DC) voltage. The capacitor can be charged with a voltage corresponding to the first voltage. The switch can turn on or off in accordance with the state of the output unit. The operational amplifier can have an output of the output unit input to a non-inverted input terminal thereof. The operational amplifier can operate as a voltage follower to charge the capacitor as the switch turns on when the first voltage is input, and can operate as a comparator to compare the voltage charged in the capacitor and the second voltage as the switch turns off when the second voltage is input.

The operational amplifier can have a Miller compensation capacitance for phase compensation, and an invalidating unit that invalidates the effect of the Miller compensation capacitance when the operational amplifier operates as a comparator. The invalidating unit can be connected in series with the Miller compensation capacitance and can have a switch that turns off when the operational amplifier operates as a comparator. The capacitor can be provided between a feedback loop of the voltage follower and GND. The switch can be provided between an output terminal and an inverted input terminal of the operational amplifier. The output unit can include a transistor element.

The current detecting circuit can include a first low-pass filter. The voltage corresponding to the AC voltage is filtered with the first low-pass filter. It can include a second low-pass filter provided between the output unit and the non-inverted output terminal. It can include a level shift circuit provided between a site where the DC voltage is output and the output unit.

Another aspect of the present invention is a DC to DC converter incorporating the voltage or current detecting circuit described above.

After the capacitor is charged once with the voltage corresponding to the DC or AC voltage, the voltage can be compared with the voltage corresponding to the AC or DC voltage. Thus, the influence of the input offset voltage in the operational amplifier can be eliminated easily and securely.

DETAILED DESCRIPTION

Figure 1:
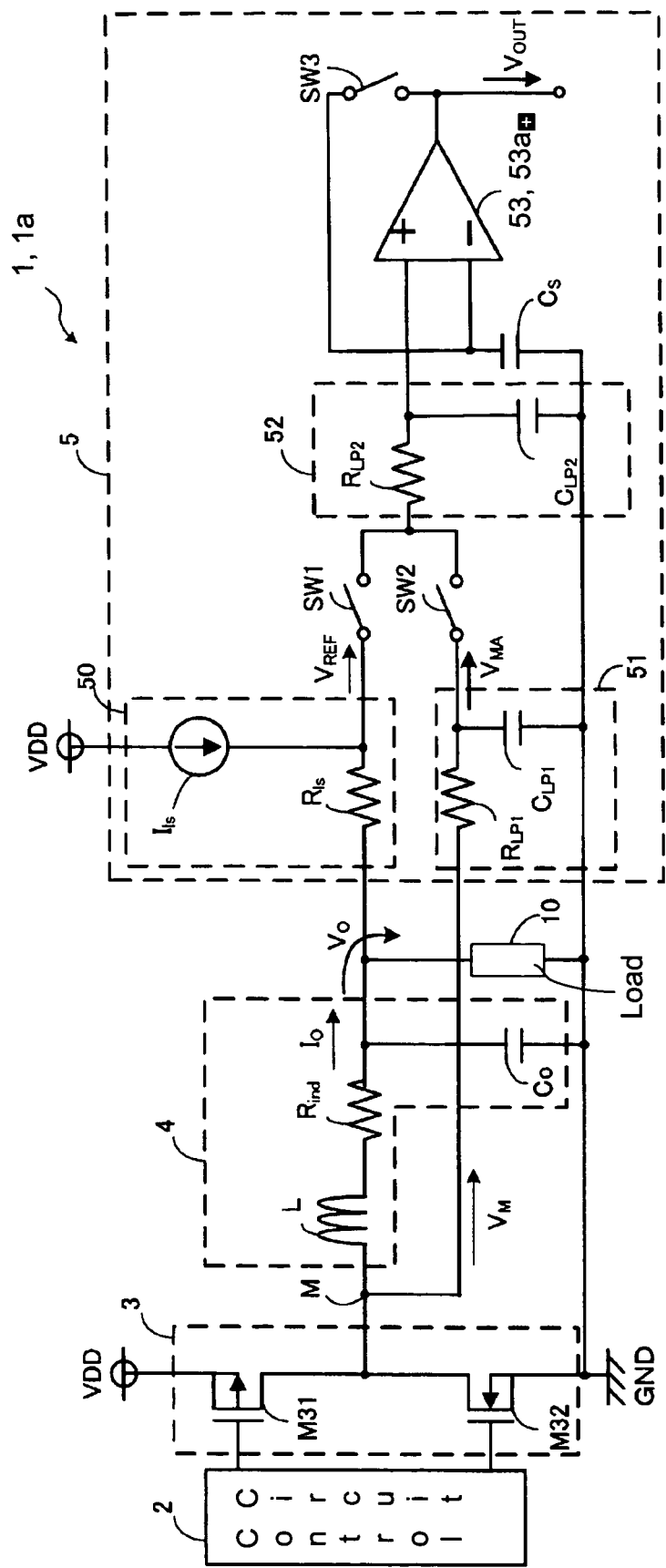
FIG. 1 is a circuit diagram showing a DC to DC converter according to the present invention.

In the embodiment of FIG. 1, the DC to DC converter 1 can be a synchronous rectification DC to DC converter. The left side on the FIG. 1 is referred to as "left". The DC to DC converter 1 has a control circuit 2, a switching circuit 3, which includes a PMOS transistor M31 and an NMOS transistor M32, a smoothing circuit 4, which includes an inductor L and an output capacitor Co, and a current detecting circuit 5.

The control circuit 2 is connected to the switching circuit 3 and controls the switching operation of the switching circuit 3 to lower the power supply voltage of a DC input power source VDD to acquire a predetermined DC voltage. A load 10 is connected to an output part of the switching circuit 3 via the smoothing circuit 4. As the transistors M31 and M32 are controlled to be alternately turned on and off within a predetermined switching period by the control circuit 2, an output voltage $V_O$ of predetermined magnitude is supplied to the load 10. Although the parasitic resistance $R_{ind}$ component of the inductor L of the smoothing circuit 4 is illustrated as a resistor, in actual practice, no resistor is intentionally provided.

The current detecting circuit 5 detects an average value of a current flowing through the inductor L (i.e., output current) based on the difference between an average voltage $V_{MA}$ at a node M of the switching circuit 3 and the smoothing circuit 4 and the output voltage $V_O$ being equal to an average value of voltage drop due to the resistance component $R_{ind}$ of the inductor L. The current detecting circuit 5 has a level shift circuit 50, which includes a resistor $R_{ls}$ and a current source $I_{ls}$, a low-pass filter 51, which is led out from the node M via a signal line and includes a resistor $R_{LP1}$ and a capacitor $C_{LP1}$. The current detecting circuit further has a switch SW1 provided after the level shift circuit 50, a switch SW2 provided after the low-pass filter 51, a low-pass filter 52 that is provided after the switches SW1 and SW2 and includes a resistor $R_{LP2}$ and a capacitor $C_{LP2}$, an operational amplifier 53, a switch SW3 provided between an output terminal and an inverted input terminal of the operational amplifier 53, and a capacitor $C_S$ provided between the inverted input terminal of the operational amplifier 53 and GND.

The level shift circuit 50 performs level shifting by generating a level shift value based on the potential difference between the two ends of the resistor $R_{ls}$ on application of the current source $I_{ls}$ and supplies a reference voltage $V_{REF}=V_O+R_{ls}\cdot I_{ls}$ to the switch SW1. Here, the values of the resistor $R_{ls}$ and the current source $I_{ls}$ are defined to hold the following relation with a current $I_{lim}$ as a criterion for judging the magnitude of an output current $I_O$: $R_{ind}\cdot I_{lim}=R_{ls}\cdot I_{ls}$. The current $I_{ls}$ is significantly smaller than the output current $I_O$ and therefore does not affect the circuit on the left side to the load 10.

The low-pass filter 52 is connected to a non-inverted input terminal of the operational amplifier 53. The low-pass filter 51 is adapted for smoothing the voltage $V_M$ at the node M to acquire the average voltage $V_{MA}$ thereof. Since the voltage to be detected by the low-pass filter 52 is small, the low-pass filter 52 is provided to further reduce the ripple voltage. The switches SW1 and SW2 form an output unit that selectively outputs the voltage input to the non-inverted input terminal of the operational amplifier 53 from the node M via the low-pass filter 51 and the low-pass filter 52, or the output voltage $V_O$ input to the non-inverted input terminal of the operational amplifier 53 via the level shift circuit 50 and the low-pass filter 52. Each of these switches SW1, SW2, and SW3 includes a transistor element, such as a MOSFET, and turns on and off in accordance with a control signal from the control circuit 2.

Figure 2:
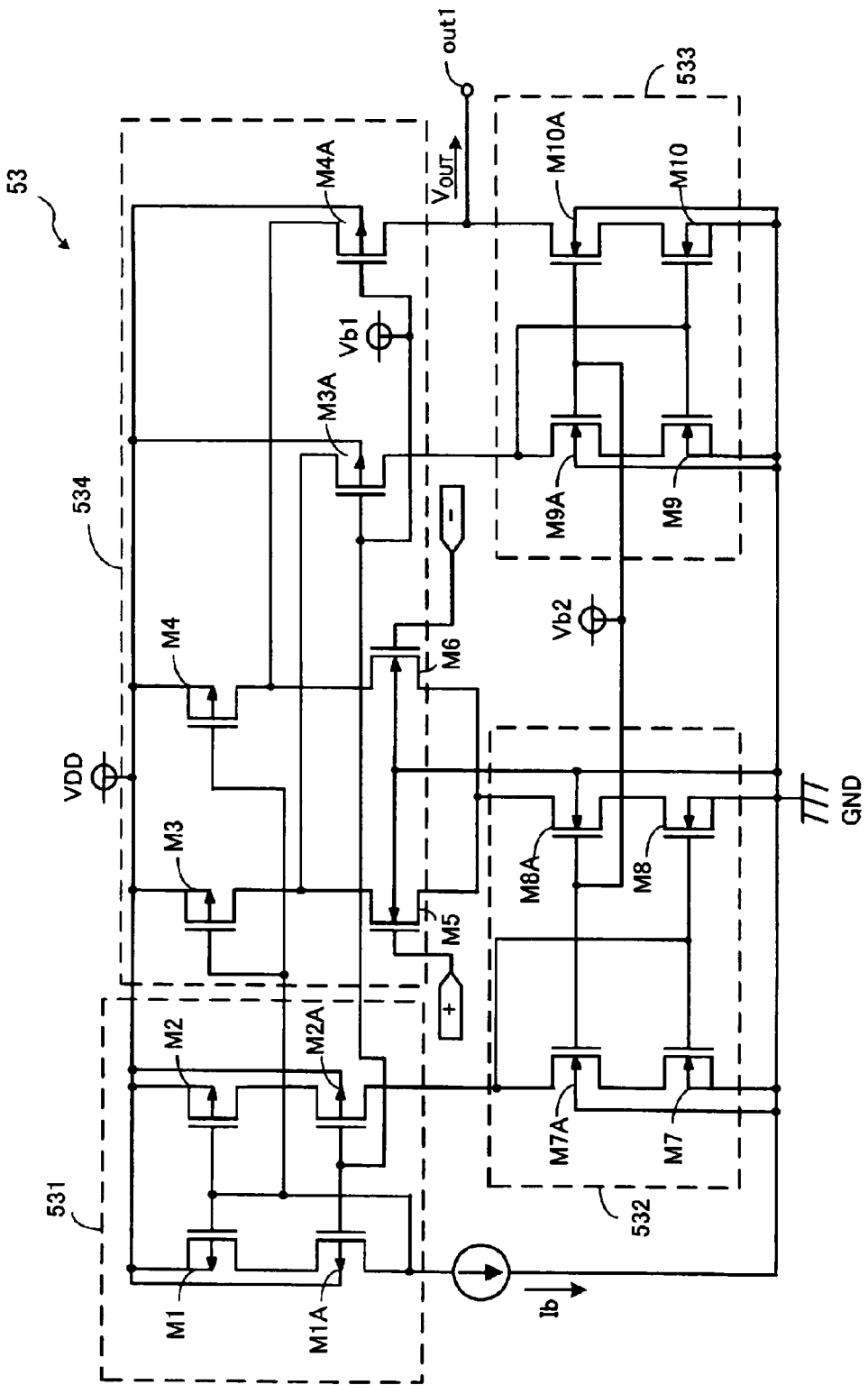
FIG. 2 is a circuit diagram showing a first embodiment of an internal circuit of an operational amplifier of FIG. 1.

Referring to FIG. 2, the internal circuit of the operational amplifier 53 (first embodiment) will now be described. The operational amplifier 53 according to the first embodiment has a cascode constant-current circuit 531, which includes PMOS transistors M1, M2, M1A, and M2A, a cascode constant-current circuit 532, which includes NMOS transistors M7, M8, M7A, and M8A, a cascode current mirror circuit 533, which includes NMOS transistors M9, M10, M9A, and M10A, and a differential amplifier 534, which includes PMOS transistors M3, M4, M3A, M4A, and NMOS transistors M5, M6.

The transistors M1, M2, M3, and M4 have their gates connected to each other, forming a current mirror circuit. The transistors M7 and M8 have their gates connected to each other, forming a current mirror circuit. The transistors M9 and M10 have their gates connected to each other, forming a current mirror circuit. The transistor M1 and the transistor M1A are cascode-connected. The transistor M2 and the transistor M2A, the transistor M7 and the transistor M7A, the transistor M8 and the transistor M8A, the transistor M9 and the transistor M9A, and the transistor M10 and the transistor M10A are similarly connected. The transistors M1A, M2A, M3A, and M4A have their gates connected to a terminal Vb1. The transistors M7A, M8A, M9A, and M10A have their gates connected to a terminal Vb2. A predetermined constant voltage is supplied to the terminal Vb1 and the terminal Vb2.

The gate of the transistor M5 is connected to the non-inverted input terminal. The gate of the transistor M6 is connected to the inverted input terminal. The transistors M5, M6, M3A and M4A are folded-cascode-connected in loop back. That is, the difference between the voltages input to the transistors M5 and M6 is amplified, folded back by the transistors M3A and M4A, and output from an output terminal out1. Thus, a sufficient gain and output voltage range can be secured.

As described in JP-A-2005-65447 and US 2005/0057229 A1, the magnitude of the output current $I_O$ of the DC to DC converter 1 is expressed by the following equation (1) (note that the equation (3) in JP-A-2005-65447 and US 2005/0057229 A1 lacks the description of "−" in the right member):

$$I_O=(V_{MA}-V_O)/R_{ind} \qquad (1),$$

where $V_{MA}$ represents the output voltage output form the switching circuit 3 via the low-pass filter 51, and $V_O$ is expressed by the following equation (2):

$$V_O = V_{MA} - R_{ind} \cdot I_O \quad (2).$$

Since the level shift circuit 50 is provided, the magnitude of the output current $I_O$ of the DC to DC converter 1 can be expressed by the following equation (3):

$$I_O = (V_{MA} - (V_{REF} - R_{ls} \cdot I_{ls}))/R_{ind} \quad (3).$$

Therefore, the magnitude of the output current $I_O$ can be easily calculated from the voltage difference between the voltages applied to the switch SW1 and the switch SW2, utilizing the parasitic resistance component $R_{ind}$ of the inductor L.

Referring back to FIG. 1, the operation of the current detecting circuit 5 will be described now. In the initial state, all the switches SW1, SW2, and SW3 are off. First, as the DC to DC converter 1 starts operating, the voltage $V_{REF}$ acquired by level-shifting the output voltage $V_O$ by the level shift circuit 50 is supplied to the switch SW1, and the voltage $V_M$ that passed through the low-pass filter 51, that is, the voltage $V_{MA}$, is supplied to the switch SW2. Next, the control circuit 2 simultaneously turns on the switch SW1 and the switch SW3. In the following, the period during which the switches SW1 and SW3 are on is referred to as "period P1". Thus, the operational amplifier 53 operates as a voltage follower during the period P1. The output voltage $V_{OUT}$ of the operational amplifier 53 in this case can be expressed by the following equation (4):

$$V_{OUT} = V_{REF} - \Delta V_{IN} \quad (4),$$

where $\Delta V_{IN}$ represents the input offset voltage of the operational amplifier 53. The capacitor $C_S$ is charged with the voltage $V_{REF} - \Delta V_{IN}$.

After the lapse of the period P1, the control circuit 2 simultaneously turns off the switch SW1 and the switch SW3 and turns on the switch SW2. In the following, the period during which the switch SW2 is on is referred to as "period P2". Thus, the operational amplifier 53 operates as a comparator during the period P2. That is, the operational amplifier 53 compares the voltage ($V_{REF} - \Delta V_{IN}$) held in the capacitor $C_S$ with the input voltage ($V_{MA} - \Delta V_{IN}$), which includes the input offset voltage. If the voltage ($V_{MA} - \Delta V_{IN}$) is larger, the output voltage of the operational amplifier 53 is $V_{OUT}$=VDD. If the input voltage ($V_{REF} - \Delta V_{IN}$) is larger, a signal of GND level is output from the operational amplifier 53.

In accordance with the result of this comparison, the control circuit 2 controls the transistors M31 and M32 of the switching circuit 3 so that they alternately turn on and off during the switching operation. Thus, the output current can be controlled to a desired value.

As described above, in the first embodiment of the DC to DC converter 1, instead of directly comparing the voltages $V_{REF}$ and $V_{MA}$ applied to the current detecting circuit 5, the capacitor $C_S$ is charged once with the voltage $V_{REF}$ and then the voltage $V_{REF}$ is compared with the voltage $V_{MA}$. That is, the detecting method in the current detecting circuit 5 can be expressed by the following equation (5):

$$(V_{MA} - \Delta V_{IN}) - (V_{REF} - \Delta V_{IN}) = V_{MA} - V_{REF} \quad (5).$$

Since the voltage held in the capacitor $C_S$ changes in accordance with the magnitude of the input offset voltage $\Delta V_{IN}$ of the operational amplifier 53, the magnitude of the input offset voltage $\Delta V_{IN}$ does not influence the result of the comparison. That is, the influence of the offset voltage $\Delta V_{IN}$ of the operational amplifier 53 can be eliminated easily and securely. Thus, more accurate voltage detection can be carried out than in the case of inputting the voltages $V_{REF}$ and $V_{MA}$ to the comparator and comparing these voltages. That is, even if the offset voltage $\Delta V_{IN}$ exists, its influence can be canceled and the voltages $V_{REF}$ and $V_{MA}$ can be compared correctly.

Since the voltage $V_{REF}$ is expressed as $V_{REF} = V_O + R_{ls} \cdot I_{ls}$, it can be substituted into the equation (2) to provide the following equation (6):

$$V_{REF} = V_{MA} - R_{ind} \cdot I_O + R_{ls} \cdot I_{ls} \quad (6).$$

And the equation (6) can be substituted into the equation (5) to provide the following equation (7):

$$V_{MA} - V_{REF} = R_{ind} \cdot I_O - R_{ls} \cdot I_{ls} \quad (7).$$

Comparing the voltages $V_{REF}$ and $V_{MA}$ is equal to comparing $R_{ind} \cdot I_O$ and $R_{ls} \cdot I_{ls}$. Moreover, considering the above-described condition of $R_{ind} \cdot I_{lim} = R_{ls} \cdot I_{ls}$, ultimately, the output current $I_O$ is compared with the current $I_{lim}$, which is the criterion for judging the magnitude of the output current $I_O$. The output voltage $V_{OUT}$ of the operational amplifier 53 is the voltage VDD when $I_O$ is larger than $I_{lim}$. The output voltage $V_{OUT}$ of the operational amplifier 53 is the GND level when $I_O$ is smaller than $I_{lim}$. In this manner, a very accurate current detection can be carried out. In accordance with this result, transition to a light load mode or the like can be made.

By using the difference between the output voltage $V_{REF}$ and the output voltage $V_{MA}$, that is, the difference in potential between both ends of the resistance $R_{ind}$, for voltage detection, it is possible to detect the current without lowering the efficiency of the DC to DC converter 1 and to simplify the construction of the current detecting circuit 5.

In the first embodiment, as the operational amplifier 53 of single-stage amplification (having one amplification stage) is provided, the capacitor $C_S$ also functions as a phase compensation capacitor during the period P1. Therefore, stability can be improved. Moreover, while primary RC filters are provided as the low-pass filters 51 and 52 in the first embodiment, secondary or higher-order filters also can be used.

Next, the second embodiment of the DC to DC converter 1a will be described. Hereinafter, the difference between the first and second embodiments mainly will be described. The DC to DC converter 1a is similar to the DC to DC converter 1, except for the operational amplifier.

Figure 3:
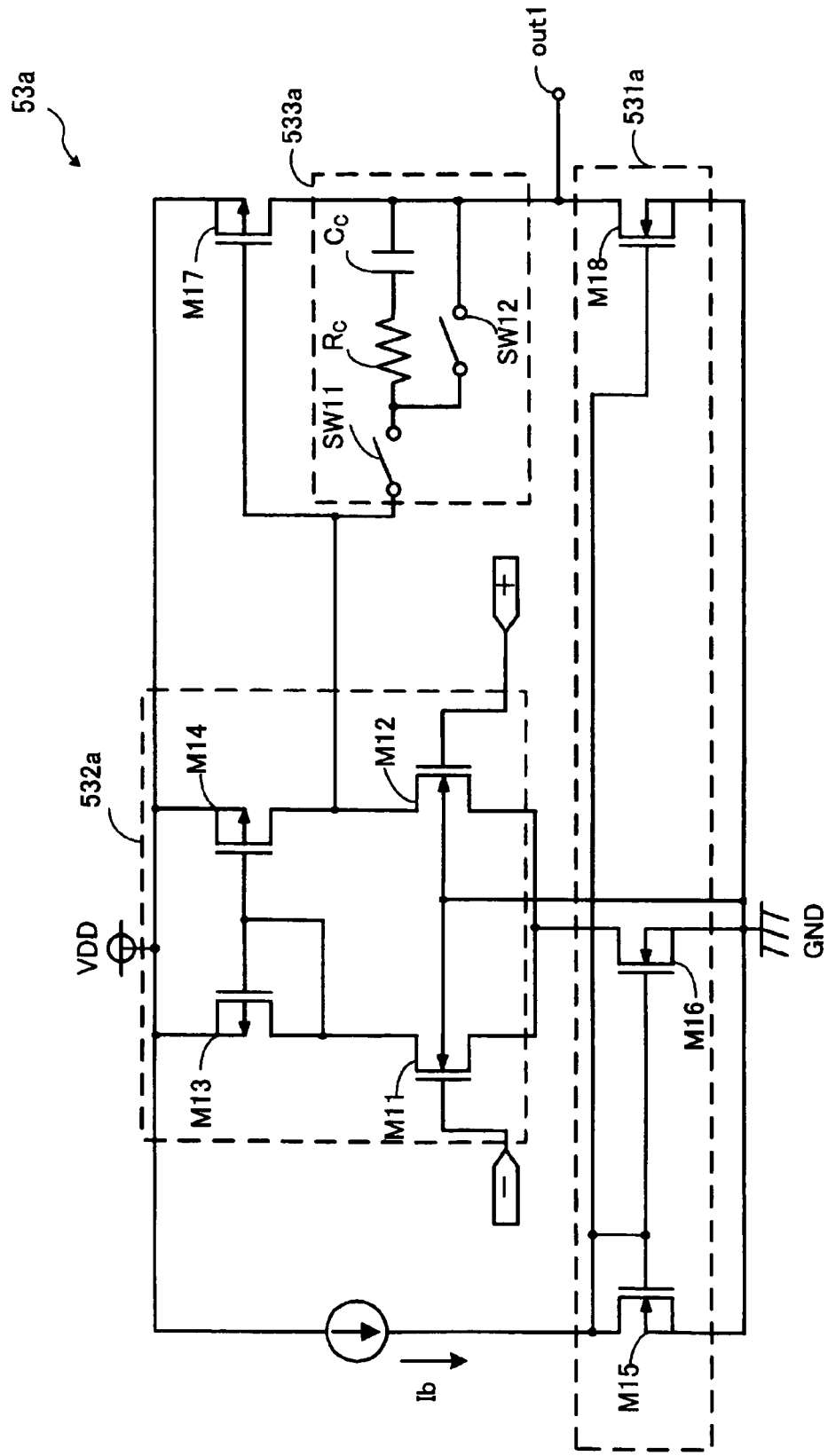
FIG. 3 is a circuit diagram showing a second embodiment of an internal circuit of an operational amplifier of FIG. 1.
Figure 4:
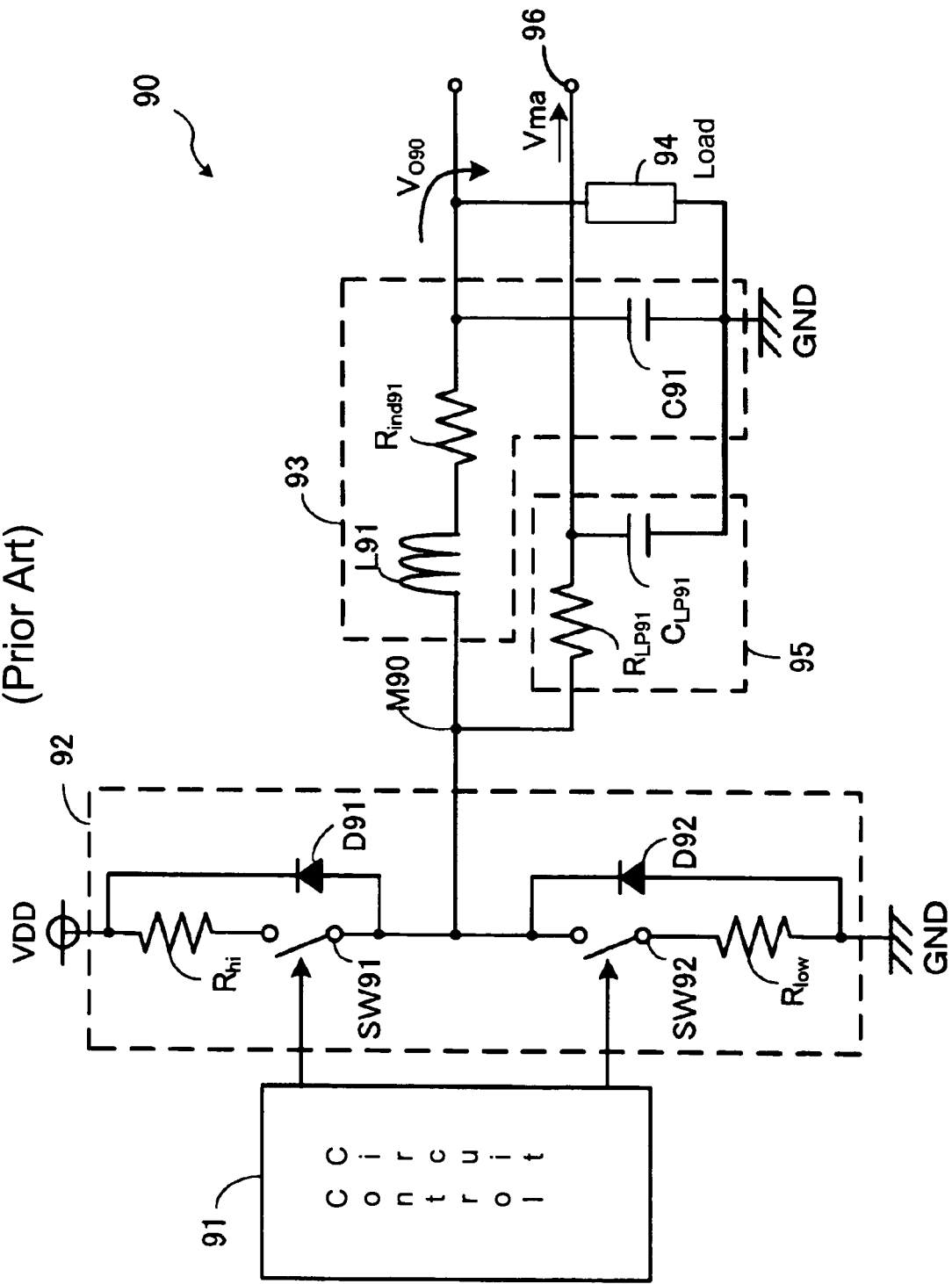
FIG. 4 is a circuit diagram showing a current detecting device of a conventional DC to DC converter.

Referring to FIG. 3, which illustrates a circuit diagram of an operational amplifier 53a in the DC to DC converter 1a (second embodiment), the operational amplifier 53a has a two-stage amplification. The operational amplifier 53a has a constant-current circuit 531a, which includes NMOS transistors M15, M16, and M18, a differential amplification stage 532a, which includes PMOS transistors M13 and M14 and NMOS transistors M11 and M12, a PMOS transistor M17 forming the second amplification stage, and a phase compensation circuit 533a arranged between the gate and drain of the transistor M17.

The phase compensation circuit 533a is arranged for providing phase compensation by Miller effect and has a switch SW11, a resistor $R_C$ and a capacitor $C_C$ connected in series in this order from the gate side to the drain side of the transistor M17, and a switch SW12 arranged between the drain-side terminal of the switch SW11 and the drain of the transistor M17. Each of the switches SW11 and SW12 includes a transistor element, such as a MOSFET, and turns on or off in accordance with a control signal from a control circuit 2.

The operation of the phase compensation circuit 533a will now be described. During the period P1, the switch SW11 turns on. Thus, the phase compensation circuit 533a has a phase compensation function to adjust the phase of an internal signal of the operational amplifier 53a to prevent oscillation. Meanwhile, during the period P2, as the switch SW11 turns off, the phase compensation effect is invalidated. Thus, delay of change in the output voltage can be prevented easily and securely.

The switch SW12 is provided for preventing the potential at the terminal of the switch SW11 on the switch SW12 side from becoming higher than the power supply voltage VDD. Thus, when the switch SW11 is on, if the voltage at the output terminal out1 of the operational amplifier 53a is low (that is, if the output voltage Vout is low), positive electric charges are accumulated at the electrode of the capacitor $C_C$ on the switch SW11 side. After that, however, when the switch SW11 is turned off, the drain current of the switch SW11 is prevented from exceeding the power supply voltage VDD as the voltage at the output terminal out1 becomes substantially equal to the power supply voltage VDD.

The DC to DC converter 1a according to the second embodiment has an effect similar to that of the DC to DC converter 1 according to the first embodiment. In the second embodiment, the switch SW11 is arranged between the gate of the transistors M17 and the resistor $R_C$. However, the arrangement of the switch SW11 is not particularly limited as long as the phase compensation circuit 533a has the phase compensation function during the period P1 while its phase compensation effect is invalidated during the period P2, in accordance with the state of the switch SW11. For example, the switch SW11 can be arranged between the output terminal out1 and the capacitor $C_C$.

The voltage detecting circuit and current detecting circuit according the present invention are described above with reference to specific exemplary embodiments. The present invention, however, is not to be limited to these embodiments, and the construction of each part can be replaced by any construction having similar functions. For example, during the period P1, the switch SW2 and the switch SW3 can be turned on, and during the period P2, the switch SW2 and the switch SW3 can be simultaneously turned off and the switch SW1 can be turned on. In this case, the capacitor $C_S$ is charged with the voltage ($V_{MA}-\Delta V_{IN}$) during the period P1, and it is compared with ($V_{REF}-\Delta V_{IN}$) during the period P2. Moreover, other functionality can be added. This present voltage detecting circuit and current detecting circuit can include a combination of any two or more constructions (features) of the above-described embodiments. The voltage detecting circuit and current detecting circuit can be applied not only to the DC to DC converter but also to various devices and circuits, such as a DC chopper.

While the present invention has been particularly shown and described with reference to particular embodiments, it will be understood by those skilled in the art that the foregoing and other changes in form and details can be made therein without departing from the spirit and scope of the present invention. All modifications and equivalents attainable by one versed in the art from the present disclosure within the scope and spirit of the present invention are to be included as further embodiments of the present invention. The scope of the present invention accordingly is to be defined as set forth in the appended claims.

This application is based on, and claims priority to, JP PA 2005-143415, filed on 17 May 2005. The disclosure of the priority application, in its entirety, including the drawings, claims, and the specification thereof, is incorporated herein by reference.

What is claimed is:

1. A voltage detecting circuit for detecting a minute voltage in a DC to DC converter circuit having a switching circuit for converting a DC input voltage to an AC voltage, and a smoothing circuit including an inductor for smoothing and converting the AC voltage from the switching circuit to a desired DC voltage, the voltage detecting circuit comprising:
   a first output providing one of the DC voltage output from the smoothing circuit or the AC voltage output from the switching circuit;
   a second output providing the other of the DC voltage output from the smoothing circuit or the AC voltage output from the switching circuit;
   an operational amplifier;
   an output unit that selectively outputs one of the DC voltage or the AC voltage from one of the first or the second output to a non-inverted input of the operational amplifier;
   a capacitor chargeable with the voltage output from the output unit and connected to an inverted input of the operational amplifier; and
   a switch that turns on to connect an output of the operational amplifier to the inverted input of the operational amplifier or off to disconnect the output of the operational amplifier to the inverted input of the operational amplifier in accordance with the state of the output unit,
   wherein the operational amplifier operates as a voltage follower to charge the capacitor as the switch turns on when the first output is input to the non-inverted input of the operational amplifier, and
   wherein the operational amplifier operates as a comparator to compare the voltage charged in the capacitor with the voltage from the second output as the switch turns off when the second output is input to the non-inverted input of the operational amplifier.

2. The voltage detecting circuit according to claim 1, wherein the operational amplifier has;
   a Miller compensation capacitance for phase compensation; and
   an invalidating unit that invalidates the effect of the Miller compensation capacitance when the operational amplifier operates as a comparator.

3. The voltage detecting circuit according to claim 2, wherein the invalidating unit is connected in series with the Miller compensation capacitance and has a switch that turns off when the operational amplifier operates as a comparator.

4. The voltage detecting circuit according to claim 1, wherein the capacitor is connected to a ground.

5. The voltage detecting circuit according to claim 1, wherein the operational amplifier operates as a voltage follower when the DC voltage output from the smoothing circuit is input to the non-inverted input of the operational amplifier, and wherein the operational amplifier operates as a comparator when the AC voltage output from the smoothing circuit is input to the non-inverted input of the operational amplifier.

6. The voltage detecting circuit according to claim 1, wherein the output unit includes a transistor element.

7. A DC to DC converter including the voltage detecting circuit according to claim 1.

8. A current detecting circuit for a DC to DC converter circuit having a switching circuit for converting a DC input voltage to an AC voltage and a smoothing circuit including an inductor for smoothing and converting the AC voltage from the switching circuit to a desired DC voltage, the current detecting circuit comprising:

a first output providing one of the DC voltage output from the smoothing circuit or the AC voltage output from the switching circuit;

a second output providing the other of the DC voltage output from the smoothing circuit or the AC voltage output from the switching circuit;

an operational amplifier;

an output unit that selectively outputs one of the DC voltage or the AC voltage from one of the first or the second output to a non-inverted input of the operational amplifier a capacitor chargeable with the voltage output from the output unit and connected to an inverted input of the operational amplifier; and a switch that turns on to connect an output of the operational amplifier to the inverted input of the operational amplifier or off to disconnect the output of the operational amplifier to the inverted input of the operational amplifier in accordance with the state of the output unit, wherein the operational amplifier operates as a voltage follower to charge the capacitor as the switch turns on when the first output is input to the non-inverted input of the operational amplifier, and wherein the operational amplifier operates as a comparator to compare the voltage charged in the capacitor with the voltage from the second output as the switch turns off when the second output is input to the non-inverted input of the operational amplifier.

9. The current detecting circuit according to claim 8, further including a first low-pass filter configured to filter the AC voltage output from the switching circuit.

10. The current detecting circuit according to claim 8, further including a second low-pass filter configured to filter the voltage output from the output unit.

11. The current detecting circuit according to claim 8, further including a level shift circuit configured to level shifting the DC voltage output from the smoothing circuit.

12. A DC to DC converter including the current detecting circuit according to claim 8.

* * * * *